US 6,254,746 B1

(12) United States Patent
Subramani et al.

(10) Patent No.: US 6,254,746 B1
(45) Date of Patent: *Jul. 3, 2001

(54) RECESSED COIL FOR GENERATING A PLASMA

(75) Inventors: Anantha Subramani, San Jose; John C. Forster, San Francisco; Bradley O. Stimson, San Jose; Sergio Edelstein, Los Gatos; Howard Grunes, Santa Cruz; Avi Tepman, Cupertino; Zheng Xu, Foster City, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/853,024

(22) Filed: May 8, 1997

Related U.S. Application Data

(63) Continuation-in-part of application No. 08/647,182, filed on May 9, 1996.

(51) Int. Cl.[7] .................................................. C23C 14/34
(52) U.S. Cl. ............. 204/298.11; 156/345; 204/298.06; 204/298.32; 204/298.34; 204/298.01; 118/715; 118/723 E; 118/723 I; 118/723 AN
(58) Field of Search ...................... 156/345; 204/298.11, 204/298.06, 298.32, 298.34, 298.01; 118/723 E, 723 ER, 723 I, 723 IR, 723 AN, 715

(56) References Cited

U.S. PATENT DOCUMENTS

| 3,594,301 | 7/1971 | Bruch | 204/298.26 |
|---|---|---|---|
| 4,336,118 | 6/1982 | Patten et al. | 204/192.12 |
| 4,362,632 | 12/1982 | Jacob | 422/186.04 |
| 4,626,312 | 12/1986 | Tracy | 156/345 |
| 4,661,228 | 4/1987 | Mintz | 204/192.25 |
| 4,716,491 | 12/1987 | Ohno et al. | 361/230 |
| 4,792,732 | 12/1988 | O'Loughlin | 315/334 |
| 4,842,703 | 6/1989 | Class et al. | 204/192.12 |

(List continued on next page.)

FOREIGN PATENT DOCUMENTS

| 3528771 | 2/1987 | (DE) . |
|---|---|---|
| 0520519 | 12/1992 | (EP) . |
| 0601595 | 12/1993 | (EP) . |
| 0607797 | 1/1994 | (EP) . |
| 0593924 | 4/1994 | (EP) . |
| 0618606 | 10/1994 | (EP) . |
| 0625792 | 11/1994 | (EP) . |
| 0727807 | 1/1996 | (EP) . |

(List continued on next page.)

OTHER PUBLICATIONS

PCT Search Report issued in Appln PCT/US98/09739.
Declaration of Anahtha Subramani dated Oct. 31, 2000, with Exhibit A.
European Patent Office Examination Report dated Nov. 8, 1999 in Application No. 97 925 528.8.
Singapore Search Report mailed Jul. 9, 1999 in Singapore Appln. No. 9706208-7, filed May 8, 1997.
U.S. Ser. No. 09/173,664 (Atty. Dkt. No. 1802).
U.S. Ser. No. 09/173,662 (Atty. Dkt. No. 1912).

(List continued on next page.)

*Primary Examiner*—Rodney G. McDonald
(74) *Attorney, Agent, or Firm*—Konrad Raynes & Victor LLP

(57) ABSTRACT

A recessed coil for a plasma chamber in a semiconductor fabrication system is provided. Recessing the coil reduces deposition of material onto the coil which in turn leads to a reduction in particulate matter shed by the coil onto the workpiece.

60 Claims, 7 Drawing Sheets

U.S. PATENT DOCUMENTS

| | | | |
|---|---|---|---|
| 4,844,775 | 7/1989 | Keeble | 216/68 |
| 4,865,712 | 9/1989 | Mintz | 204/298.16 |
| 4,871,421 | 10/1989 | Ogle et al. | 438/710 |
| 4,917,044 * | 4/1990 | Yau et al. | 118/723 E |
| 4,918,031 | 4/1990 | Flamm et al. | 438/695 |
| 4,925,542 | 5/1990 | Kidd | 427/531 |
| 4,941,915 | 7/1990 | Matsuoka et al. | 204/298.12 |
| 4,948,458 | 8/1990 | Ogle | 438/729 |
| 4,990,229 | 2/1991 | Campbell et al. | 204/298.06 |
| 4,999,096 | 3/1991 | Nihei et al. | 204/192.3 |
| 5,065,698 | 11/1991 | Koike | 118/719 |
| 5,091,049 | 2/1992 | Campbell et al. | 216/37 |
| 5,122,251 | 6/1992 | Campbell et al. | 204/298.06 |
| 5,135,629 | 8/1992 | Sawada et al. | 204/192.12 |
| 5,146,137 | 9/1992 | Gesche et al. | 315/111.21 |
| 5,175,608 | 12/1992 | Nihei et al. | 257/751 |
| 5,178,739 | 1/1993 | Barnes et al. | 204/192.12 |
| 5,206,516 | 4/1993 | Keller et al. | 250/492.2 |
| 5,225,740 | 7/1993 | Ohkawa | 315/111.41 |
| 5,231,334 | 7/1993 | Paranjpe | 315/111.21 |
| 5,234,529 | 8/1993 | Johnson | 156/345 |
| 5,234,560 | 8/1993 | Kadlec et al. | 204/192.12 |
| 5,241,245 | 8/1993 | Barnes et al. | 315/111.41 |
| 5,269,881 | 12/1993 | Sekiya et al. | 134/1.1 |
| 5,280,154 | 1/1994 | Cuomo et al. | 219/121.52 |
| 5,304,279 | 4/1994 | Coultas et al. | 156/345 |
| 5,312,717 | 5/1994 | Sachdev et al. | 430/313 |
| 5,346,578 | 9/1994 | Benzing et al. | 156/345 |
| 5,361,016 | 11/1994 | Ohkawa et al. | 315/111.41 |
| 5,366,585 | 11/1994 | Robertson et al. | 216/67 |
| 5,366,590 | 11/1994 | Kadomura | 438/723 |
| 5,368,685 | 11/1994 | Kumihashi et al. | 216/70 |
| 5,397,962 | 3/1995 | Moslehi | 315/111.51 |
| 5,401,350 | 3/1995 | Patrick et al. | 156/345 |
| 5,404,079 | 4/1995 | Ohkuni et al. | 315/111.81 |
| 5,418,431 | 5/1995 | Williamson et al. | 315/111.51 |
| 5,421,891 | 6/1995 | Campbell et al. | 118/723 R |
| 5,429,070 | 7/1995 | Campbell et al. | 118/723 R |
| 5,429,710 | 7/1995 | Akiba et al. | 438/714 |
| 5,429,995 | 7/1995 | Nishiyama et al. | 438/788 |
| 5,430,355 | 7/1995 | Paranjpe | 315/111.21 |
| 5,434,353 | 7/1995 | Kraus | 174/15.6 |
| 5,464,518 | 11/1995 | Sieck et al. | 204/192.12 |
| 5,503,676 | 4/1996 | Shufflebotham et al. | 118/723 MR |
| 5,521,351 * | 5/1996 | Mahoney | 219/121.59 |
| 5,560,776 | 10/1996 | Sugai et al. | 118/723 AN |
| 5,573,595 | 11/1996 | Dible | 118/723 MP |
| 5,639,357 | 6/1997 | Xu | 204/192.3 |
| 5,683,537 | 11/1997 | Ishii | 156/345 |
| 5,690,781 | 11/1997 | Yoshida et al. | 156/345 |

FOREIGN PATENT DOCUMENTS

| | | |
|---|---|---|
| 0774886 | 5/1997 | (EP) . |
| 0782172 | 7/1997 | (EP) . |
| 1263582 | 9/1969 | (GB) . |
| 2065386 | 6/1981 | (GB) . |
| 2162365 | 1/1986 | (GB) . |
| 2231197 | 11/1990 | (GB) . |
| 59-190363 | 10/1984 | (JP) . |
| 61-190070 | 8/1986 | (JP) . |
| 6232055 | 8/1994 | (JP) . |
| 6283470 | 10/1994 | (JP) . |
| 7-106095 | 4/1995 | (JP) . |
| 7176398 | 7/1995 | (JP) . |
| 7176399 | 7/1995 | (JP) . |
| 888190 | 4/1996 | (JP) . |
| 8153712 | 6/1996 | (JP) . |
| 8288259 | 11/1996 | (JP) . |
| WO860623 | 11/1986 | (WO) . |
| 9515672 | 6/1995 | (WO) . |

OTHER PUBLICATIONS

Kurt J. Lesker Company, *Ferrofluidics Feedthroughs*, Catalog pp. 14–10 and 14–12, dated prior to May 8, 1997.

U.S. Ser. No. 08/857,921 (Atty. Dkt. No. 1737).

U.S. Ser. No. 08/857,944 (Atty. Dkt. 1871).

U.S. Ser. No. 08/907,382 (Atty. Dkt. 1957).

U.S. Ser. No. 08/908,341 (Atty. Dkt. 1873).

U.S. Ser. No. 08/908,342 (Atty. Dkt. 1620).

U.S. Ser. No. 08/931,170 (Atty. Dkt. 1812).

U.S. Ser. No. 08/971,867 (Atty. Dkt. 1957.P1).

U.S. Ser. No. 09/039,695 (Atty. Dkt. 1727).

U.S. Ser. No. 09/049,839 (Atty. Dkt. 938.D1).

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Metal Ion Deposition from Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, et al., "Filling Dual Damascene Interconnect with AlCu and Cu Using Ionized Magnetron Deposition," *J. Vac. Sci. Technol.*, vol. B13, pp. 125–129, 1995.

Y–W. Kim et al., "Ionized Sputter Deposition of AlCu: Film Microstructure and Chemistry," *J. Vac. Sci. Technol.*, vol. A12, pp. 3169–3175, 1994.

J. Hopwood et al., "Mechanisms for Highly Ionized Magnetron Sputtering," *J. Appl. Phys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

U.S. patent application Ser. No. 08/680,335, filed Jul. 10, 1996 (Atty. Dk. 1390–CIP/PVD/DV).

N. Jiwari et al., "Helicon wave plasma reactor employing single–loop antenna," *J. of Vac. Sci. Technol.*, A 12(4), pp. 1322–1327, Jul./Aug. 1994.

Search report dated Feb. 27, 1997, EPC application No. 96308251.6.

U.S. patent application Ser. No. 08/677,588, filed Jul. 9, 1996 (Atty. Dk. 1402/PVD/DV).

U.S. patent application Ser. No. 08/644,096, filed May 10, 1996 (Aty. Dk. 1390/PVD/DV).

U.S. patent application Ser. No. 08/647,184, filed May 9, 1996 (Aty. Dk. 1383/PVD/DV).

U.S. patent application Ser. No. 07/954,860, filed Sep. 30, 1992 (Atty. Dk. 364).

U.S. patent application Ser. No. 08/310,617, filed Sep. 30, 1992 (Atty. Dk. 364.P1).

U.S. patent application Ser. No. 08/567,601, filed Jun. 2, 1995 (Atty. Dk. 364.P2).

U.S. patent application Ser. No. 08/647,182, filed May 9, 1996 (Atty. Dk. 1186).

U.S. patent application Ser. No. 08/846,335, filed May 14, 1997 (Atty. Dk. 1736/PVD/DV).

U.S. patent application Ser. No. 08/851,946, filed May 6, 1997 (Atty. Dk. 1390.C1/PVD/DV).

U.S. patent application Ser. No. 08/857,719, filed May 16, 1997 (Atty. Dk. 1752/PVD/DV).

* cited by examiner

RECESSED COIL FOR GENERATING A PLASMA

RELATED APPLICATIONS

This application is a continuation-in-part application of application Ser. No. 08/647,182, filed May 9, 1996 now abandoned.

FIELD OF THE INVENTION

The present invention relates to plasma generators, and more particularly, to a method and apparatus for generating a plasma in the fabrication of semiconductor devices.

BACKGROUND OF THE INVENTION

Radio frequency (RF) generated plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created within the plasma impact the surface of the target to dislodge, i.e., "sputter" material from the target. The sputtered materials are then transported and deposited on the surface of the semiconductor wafer.

Sputtered material has a tendency to travel in straight line paths from the target to the substrate being deposited at angles which are oblique to the surface of the substrate. As a consequence, materials deposited in etched trenches and holes of semiconductor devices having trenches or holes with a high depth to width aspect ratio, can bridge over causing undesirable cavities in the deposition layer. To prevent such cavities, the sputtered material can be "collimated" into substantially vertical paths between the target and the substrate by negatively charging the substrate or substrate support and positioning appropriate vertically oriented collimating electric fields adjacent the substrate if the sputtered material is sufficiently ionized by the plasma. However, material sputtered by a low density plasma often has an ionization degree of less than 1 % which is usually insufficient to avoid the formation of an excessive number of cavities. Accordingly, it is desirable to increase the density of the plasma to increase the ionization rate of the sputtered material in order to decrease the formation degree of unwanted cavities in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

In order to maximize the energy being coupled from the coil to the plasma, it is desirable to position the coil as close as possible to the plasma itself. At the same time, however, it is also desirable to minimize the number of chamber fittings and other parts exposed to the material being sputtered so as to facilitate cleaning the interior of the chamber and to minimize the generation of particles being shed from interior surfaces. These particles shed from interior surfaces can fall on the wafer itself and contaminate the product. Accordingly, many sputtering chambers have a generally annular-shaped shield enclosing the plasma generation area between the target and the pedestal supporting the wafer. The shield provides a smooth gently curved surface which is relatively easy to clean and protects the interior of the chamber from being deposited with the sputtering material. In contrast, it is believed by the present inventors that a coil and any supporting structure for the coil would of necessity tend to have relatively sharply curved surfaces which would be more difficult to clean away deposited materials from the coil and its supporting structures. In addition, it is believed that the smooth gently curved surface of the shield would tend to shed fewer particles than the sharply curved surfaces of the coil and its supporting structure.

Thus, on the one hand, it would be desirable to place the coil outside the shield (as described in copending application Ser. No. 08/559,345, pending filed Nov. 15, 1995 for METHOD AND APPARATUS FOR LAUNCHING A HELICON WAVE IN A PLASMA which is assigned to the assignee of the present application and is incorporated herein by reference) so that the coil is shielded from the material being deposited. Such an arrangement would minimize generation of particles by the coil and its supporting structure and would facilitate cleaning of the chamber. On the other hand, it is desirable to place the coil as close as possible to the plasma generation area inside the shield to avoid any attenuation by the spacing from the plasma or by the shield itself to thereby maximize energy transfer from the coil to the plasma. Accordingly, it has been difficult to increase energy transfer from the coil to the plasma while at the same time minimizing particle generation and facilitating chamber cleaning.

SUMMARY OF THE PREFERRED EMBODIMENTS

It is an object of the present invention to provide an improved method and apparatus for generating plasmas within a chamber, obviating, for practical purposes, the above-mentioned limitations.

These and other objects and advantages are achieved by, in accordance with one aspect of the invention, a plasma generating apparatus which inductively couples electromagnetic energy from a coil which is recessed with respect to the sputtering surface of a target so as to minimize the deposition of target material onto the coil. In addition, the coil is recessed with respect to the perimeter of the pedestal (support member) and the deposition surface of the workpiece supported on the pedestal such that any target material deposited upon, and subsequently shed by, the coil onto the workpiece is minimized. As a consequence, contamination of the workpiece by particulate matter shed by the coil is reduced.

In one embodiment, the coil is partially shielded from deposition material by a dark space shield which is positioned above the coil to prevent a substantial portion of the target material from being deposited onto the coil. In an alternative embodiment, the coil is carried by a separate adapter ring which has a coil chamber to protect the coil from deposition material. In addition, the coil chamber has a floor positioned below the coil to catch particulate matter shed by the coil to reduce contamination of the workpiece.

Still further, the adapter ring coil chamber is separate from the shield. As a consequence, the shield may be separately cleaned or discarded thereby substantially facilitating the cleaning of the shield and chamber and reducing the cost of the shield itself.

In accordance with another aspect of the present invention, the coil is carried on the shield or in the adapter ring chamber by a plurality of novel coil standoffs and RF feedthrough standoffs which have an internal labyrinth structure. As explained below, the labyrinth structure permits repeated depositions of conductive materials from the target onto the coil standoffs while preventing the formation of a complete conducting path of deposited material from the coil to the shield which could short the coil to the shield which is typically at ground. In addition, the labyrinth structure permits the standoff to have a low height which can reduce the overall size of the chamber.

DETAILED DESCRIPTION OF THE DRAWINGS

Figure 1:
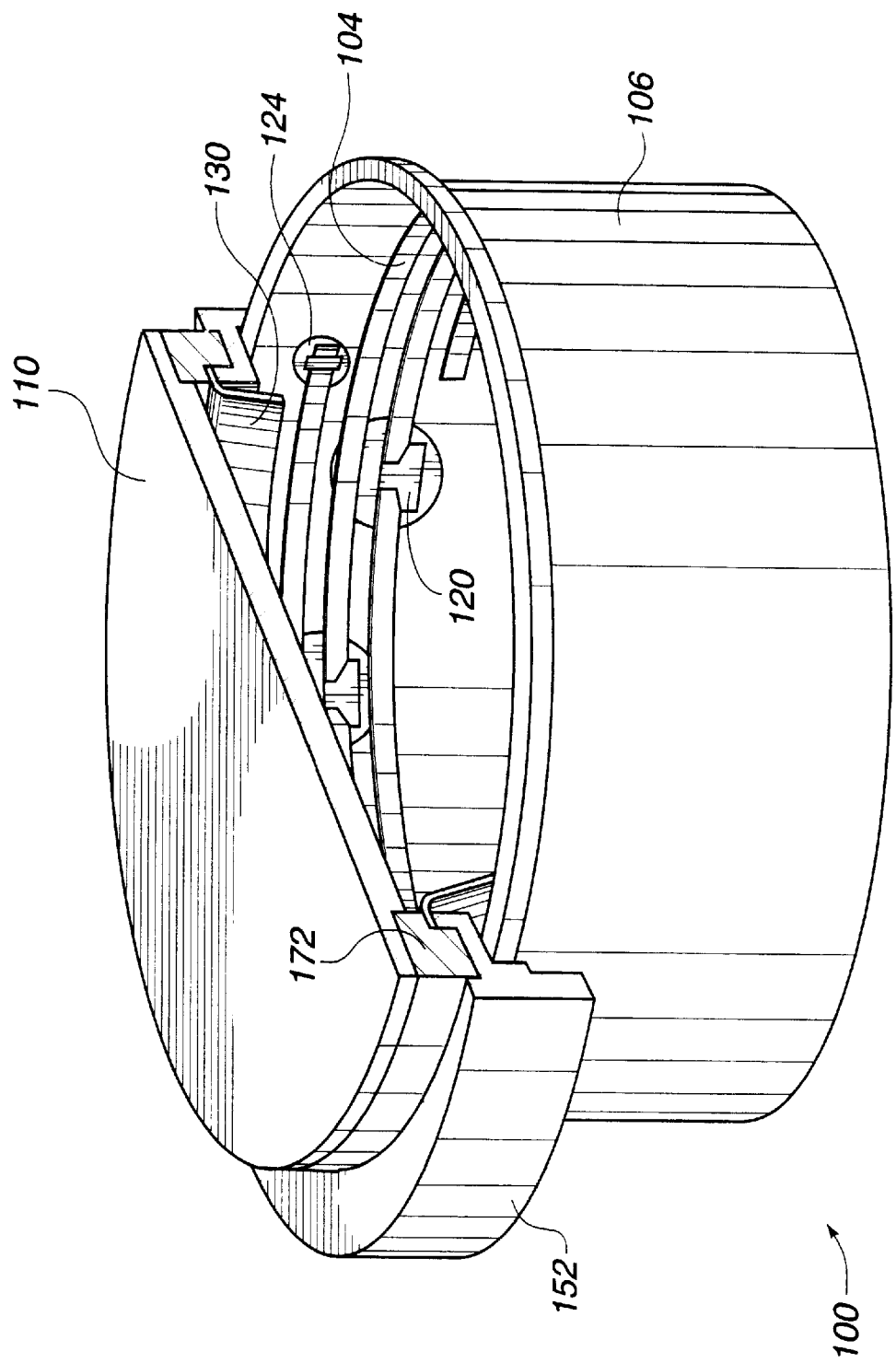
FIG. 1 is a perspective, partial cross-sectional view of a plasma generating chamber in accordance with one embodiment of the present invention.
Figure 2:
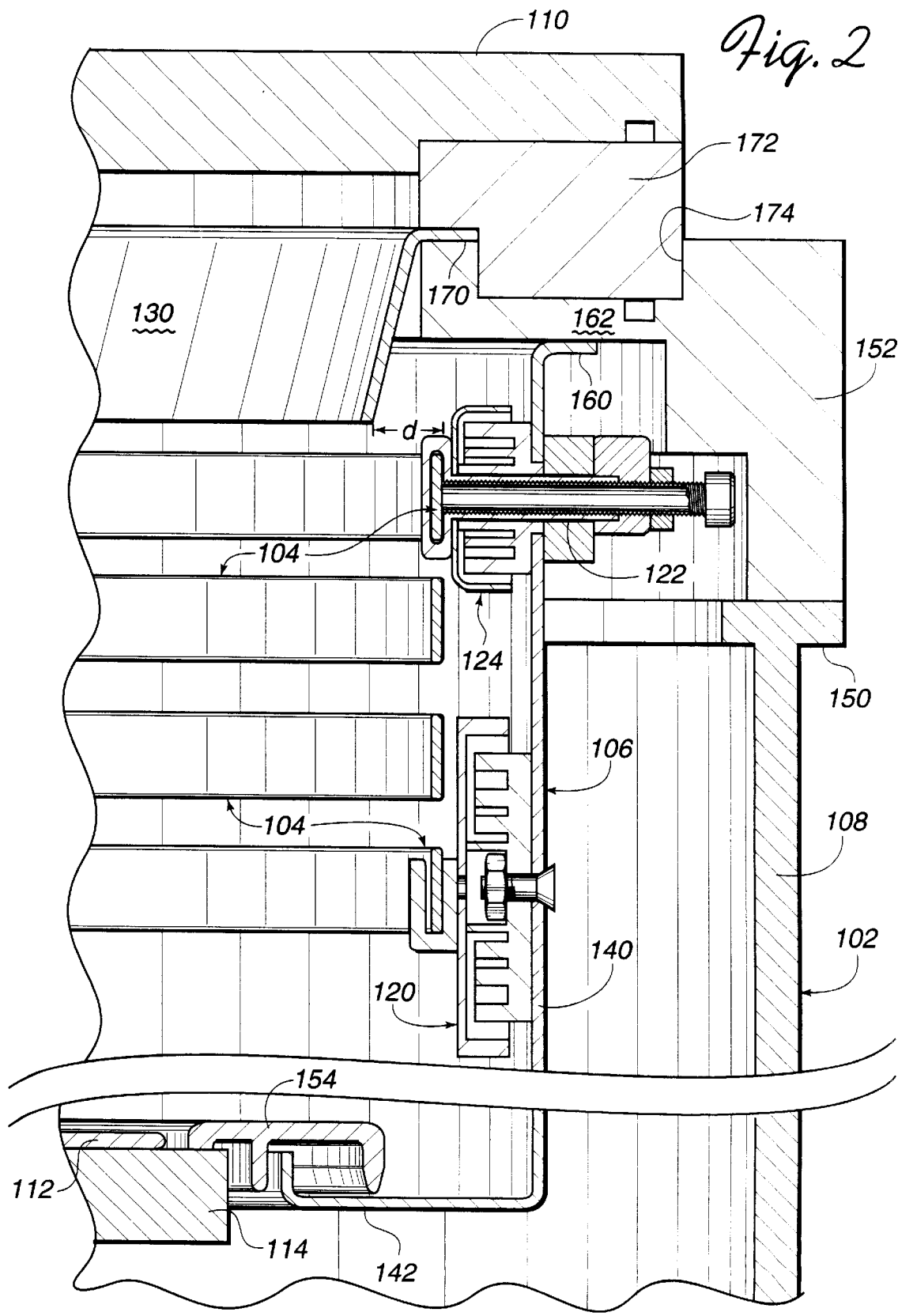
FIG. 2 is a partial cross-sectional view of the plasma generating chamber of FIG. 1 shown installed in a vacuum chamber.

Referring first to FIGS. 1 and 2, a plasma generator in accordance with a first embodiment of the present invention comprises a substantially cylindrical plasma chamber 100 which is maintainable at vacuum and in this embodiment has a single helical coil 104 which is carried internally of the chamber walls 108 by a shield 106. The shield 106 protects the interior walls 108 (FIG. 2) of the vacuum chamber 102 from the material being deposited within the interior of the plasma chamber 100.

Radio frequency (RF) energy from an RF generator is radiated from the coil 104 into the interior of the plasma chamber 100, which energizes a plasma within the plasma containment region of the plasma chamber 100. The energized plasma produces a plasma ion flux which strikes a negatively biased target 110 positioned above the plasma chamber 100. The plasma ions eject material from the target 110, which may then be deposited onto a wafer or other workpiece 112 supported by a pedestal 114 at the bottom of the plasma chamber 100. As will be explained in greater detail below, in accordance with one aspect of the present invention, the coil 104 is recessed with respect to the perimeter of the target 110 so as to minimize the deposition of target material onto the coil 104. In addition, the coil 104 is recessed with respect to the perimeter of the chuck or pedestal 114 and the workpiece 112 supported on the pedestal such that any target material subsequently shed by the coil 104 onto the workpiece 112 is minimized. As a consequence, contamination of the workpiece 112 by particulate matter shed by the coil 104 is reduced.

In accordance with another aspect of the present invention, the coil 104 is carried on the shield 106 by a plurality of novel coil standoffs 120 which electrically insulate the coil 104 from the supporting shield 106. As will be explained in greater detail below, the insulating coil support standoffs 120 have an internal labyrinth structure which permits repeated deposition of conductive materials from the target 110 onto the coil standoffs 120 while preventing the formation of a complete conducting path of deposited material from the coil 104 to the shield 106 which could short the coil 104 to the shield 106 (which is typically at ground).

To enable use of the coil as a circuit path, RF power must be passed through the chamber walls and through the shield 106 to opposite ends of the coil 104. Vacuum feedthroughs (not shown) extend through the chamber wall to provide RF current from a generator preferably located outside the chamber. Feedthroughs 124, 124a which pass RF current through the shield 106 need not be vacuum feedthroughs, as both sides of shield 106 should be at the same pressure. However, they do need to be protected from the chamber environment, so as to prevent formation of a deposition layer thereon which would create an electrical path from the coil 104 to the shield 106.

RF power is applied to the coil 104 by feedthroughs 122 which are supported by insulating feedthrough standoffs 124. The feedthrough standoffs 124, like the coil standoffs 120, permit repeated deposition of conductive material from the target onto the feedthrough standoff 124 without the formation of a conducting path which could short the coil 104 to the shield 106.

FIG. 2 shows the plasma chamber 100 installed in the vacuum chamber 102 of a PVD (physical vapor deposition) system. Although the plasma generator of the present invention is described in connection with a PVD system for illustration purposes, it should be appreciated that a plasma generator in accordance with the present invention is suitable for use with all other semiconductor fabrication processes utilizing a plasma including plasma etch, chemical vapor deposition (CVD) and various surface treatment processes.

As best seen in FIG. 2, the plasma chamber 100 has a dark space shield ring 130 which provides a ground plane with respect to the target 110 above which is negatively biased. In addition, the shield ring 130 shields the outer edges of the target from the plasma to reduce sputtering of the target outer edges. In accordance with one aspect of the present invention, the dark space shield 130 performs yet another function in that it is positioned to shield the coil 104 (and the coil support standoffs 120 and feedthrough standoffs 124) from the material being sputtered from the target 110. The dark space shield 130 does not completely shield the coil 104 and its associated supporting structure from all of the material being sputtered since some of the sputtered material travels at an oblique angle with respect to the vertical axis of the plasma chamber 100. However, because much of the sputtered material does travel parallel to the vertical axis of the chamber or at relatively small oblique angles relative to the vertical axis, the dark space shield 130 which is positioned in an overlapping fashion above the coil 104, prevents a substantial amount of sputtered material from being deposited on the coil 104. By reducing the amount of material that would otherwise be deposited on the coil 104, the generation of particles by the material which is deposited on the coil 104 (and its supporting structures) can be substantially reduced. In addition, the lifetimes of these structures may be increased as well.

In the illustrated embodiment, the dark space shield 130 is a closed continuous ring of titanium or stainless steel having a generally inverted frustoconical shape. It is recognized, of course, that the dark space shield may be made from a variety of other conductive materials and have other shapes which shield the coil 104 and its associated supporting structures from at least some of the material being deposited from the target. In the illustrated embodiment, the dark space shield extends inward toward the center of plasma chamber 100 so as to overlap the coil 104 by a distance d of ¼ inch. It is recognized, of course, that the amount of overlap can be varied depending upon the relative size and placement of the coil and other factors. For example, the overlap may be increased to increase the shielding of the coil 104 from the sputtered material but increasing the overlap could also further shield the target from the plasma which may undesirable in some applications.

The chamber shield 106 is generally bowl-shaped and includes a generally cylindrically shaped, vertically oriented wall 140 to which the standoffs 120 and 124 are attached to insulatively support the coil 104. The shield further has a generally annular-shaped floor wall 142 which surrounds the chuck or pedestal 114 which supports the workpiece 112. A clamp ring 154 clamps the wafer to the chuck 114 and covers the gap between the floor wall 142 of the shield 106 and the chuck 114. Thus, it is apparent from FIG. 2 that the chamber shield 106 together with the clamp ring 154 protects the interior of the vacuum chamber 102 from the deposition materials being deposited on the workpiece 112 in the plasma chamber 100.

The vacuum chamber wall 108 has an upper annular flange 150. The plasma chamber 100 is supported by an adapter ring assembly 152 which engages the vacuum chamber wall flange 150. The chamber shield 106 has a horizontally extending outer flange member 160 which is fastened by a plurality of fastener screws (not shown) to a horizontally extending flange member 162 of the adapter ring assembly 152. The chamber shield 106 is grounded to the system ground through the adapter ring assembly 152.

The dark space shield 130 also has an upper flange 170 which is fastened to the horizontal flange 162 of the adapter ring assembly 152. The dark space shield 130, like the chamber shield 106, is grounded through the adapter ring assembly 152.

The target 110 is generally disk-shaped and is also supported by the adapter ring assembly 152. However, the target 110 is negatively biased and therefore should be insulated from the adapter ring assembly 152 which is at ground. Accordingly, seated in a circular channel formed in the underside of the target 110 is a ceramic insulation ring assembly 172 which is also seated in a corresponding channel 174 in the upper side of the target 152. The insulator ring assembly 174 which may be made of a variety of insulative materials including ceramics spaces the target 110 from the adapter ring assembly 152 so that the target 110 may be adequately negatively biased. The target, adapter and ceramic ring assembly are provided with O-ring sealing surfaces (not shown) to provide a vacuum tight assembly from the vacuum chamber flange 150 to the target 110.

Figure 3:
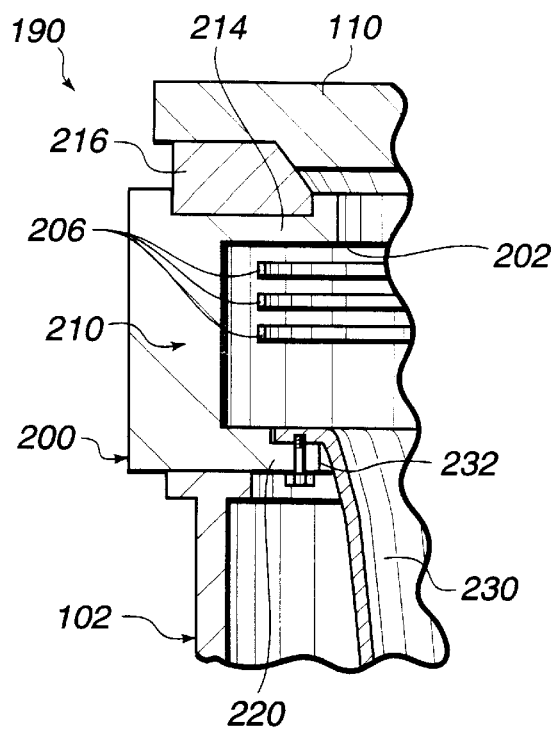
FIG. 3 is a partial cross-sectional view of a plasma generating chamber in accordance with another embodiment of the present invention.

FIG. 3 shows a recessed coil in accordance with an alternative embodiment of the present invention in which the generation of particulate matter by the coil is reduced by a different structure to reduce contamination of the workpiece. In the embodiment of FIG. 3, an adapter ring assembly 200 has been modified to form a recessed coil chamber 202 which encloses a helical coil 206 on three sides but exposes the coil 206 to the plasma at an open fourth side of the recessed coil chamber 202. In the illustrated embodiment, the recessed coil chamber 202 is generally annular shaped and is defined by a generally cylindrical vertical wall 210 which carries the coil 206 on insulative standoffs (not shown) similar to the standoffs 120 and 124 of the embodiment of FIGS. 1 and 2. The recessed coil chamber 202 further has an upper ceiling wall 214 which performs a similar function to that of the dark space shield 130 of the embodiment of FIGS. 1 and 2. More specifically, the coil chamber ceiling wall 214 provides a ground plane with respect to the negatively biased target 110 and also shields the periphery of the target 110 from the plasma. Still further, the coil chamber ceiling wall 214 shields the coil 206 to a limited extent from deposition material being ejected from the target 110. The adapter ring assembly 200 is insulatively spaced from the target 110 by an insulator ring assembly 216 between the target 110 and the top surface of the chamber sealing wall 214 of the adapter ring assembly 200.

In accordance with another aspect of the embodiment of FIG. 3, the coil chamber 202 of the adapter ring assembly 200 further has a floor wall 220 which is positioned below the coil 206. Because the coil 206 within the coil chamber 202 is recessed with respect to the target 110, it is believed that the quantity of target material which will be deposited upon the coil 206 (and its supporting structures) will be reduced. However, to the extent target materials are deposited on the coil 206, the coil chamber floor wall 220 is positioned to catch much of any particulate matter shed by the coil 206 such that the particulate matter accumulates on the coil chamber floor wall 220 rather than on the wafer or other workpiece. As a consequence, it is believed that contamination of the workpiece will be further reduced.

The plasma chamber 190 of FIG. 3 has a bowl-shaped shield 230 which is similar to the shield 106 of the embodiment of FIGS. 1 and 2. However, in another aspect of the present invention, the shield 230 is removably attached to a lower flange 232 of the adapter ring assembly 200 by screws or other suitable fasteners. Such an arrangement permits the shield 230 to be removed from the adapter ring assembly 220 and separately cleaned and reattached to the adapter ring assembly 200. Once the shield 230 has reached the end of its useful life, it may be discarded and a new shield 230 attached to the adapter ring assembly 200.

Because the coil is not supported by the shield 230 in the embodiment of FIG. 3, the surface of the shield 230 is more easily cleaned because the shield surfaces are not interrupted by standoffs for supporting the coil. Consequently, the usable life of the shield 230 may be extended. In addition, the shield may be more rapidly cleaned which can decrease downtime in which the processing chamber is idled. Still further, because the shield 230 does not have any coils or coils standoffs attached to it, the shield 230 may be more economically manufactured and therefore also more economically discarded at the end of its useful life.

Conversely, coil chamber 202 of the adapter ring assembly 200, by protecting the coil from target deposition material, can reduce the amount of cleaning necessary to remove deposited material from the coil. This can also contribute to decreasing downtime and increasing the lifetime of the coil, Furthermore, because the coil chamber 202 of the adapter ring is more readily separable from the shield 230, the coil 206 and coil chamber 202 need not be replaced when the shield 230 needs to be replaced. Because shields tend to require replacement more frequently than the coils, the cost of operation can be reduced by replacing the coils 206 less frequently than the shields 230.

Figure 4:
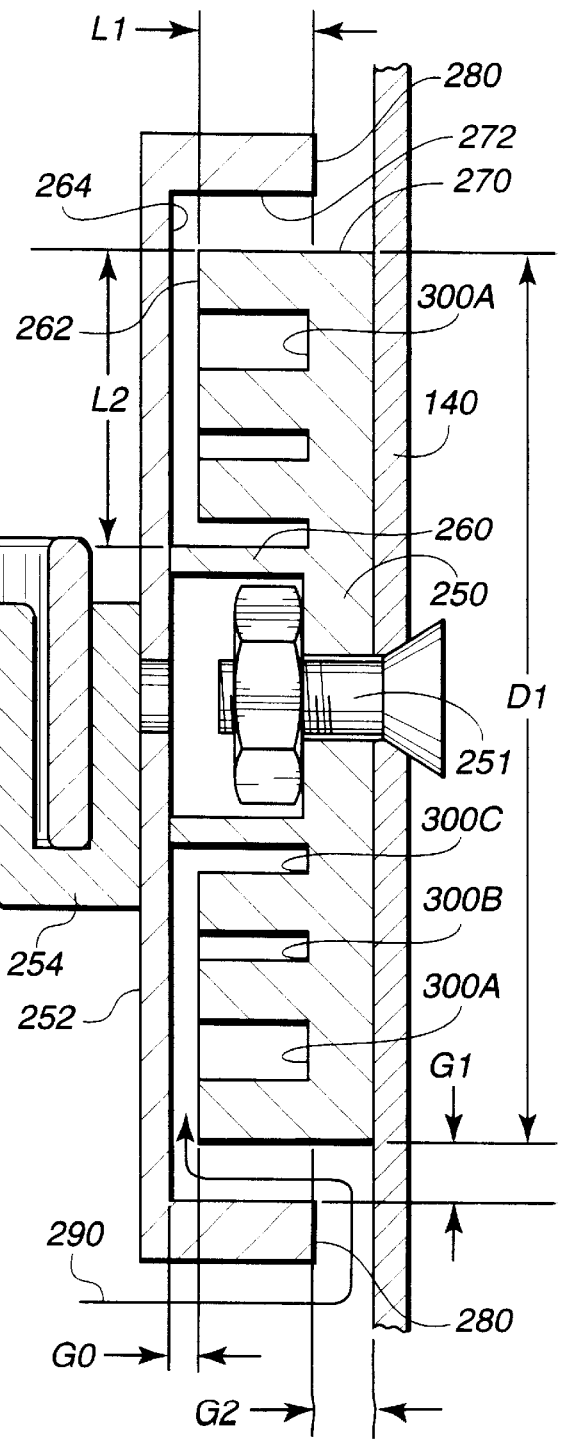
FIG. 4 is a cross-sectional view of a coil standoff of the plasma generating chamber of FIG. 2.

Turning now to FIG. 4, the internal structure of a coil standoff 120 in accordance with another aspect of the present invention is shown in greater detail. The coil standoff 120 includes a generally disk-shaped base member 250 which is preferably made of an insulative dielectric material such as a ceramic. Covering and shielding the base member 250 is a generally cylindrically shaped cover member 252 which is preferably made of the same material which is being deposited. Hence, if the material being deposited is made of titanium, the cover member 252 is preferably made of titanium as well. To facilitate adherence of the deposited material (here for example, titanium), it is preferable to treat the surface of the metal by bead blasting which will reduce shedding of particles from the deposited material.

Affixed to the front of the cover member 252 is a generally hook shaped bracket 254 of bead blasted titanium which receives and supports a turn of the coil 104. The base member 250 is shown attached to the wall 140 of the shield 106 by a bolt 251 or other suitable fastener. (The base member 250 is attached to the wall 210 of the coil chamber 202 of the embodiment of FIG. 3 in a similar manner.)

As set forth below, the base member 250 and the cover member 252 together define a labyrinth structure which inhibits the formation of a conducting path across the standoff which could short the coil to the shield (or the adapter ring of the embodiment of FIG. 3). The base member 250 has an upstanding inner circular wall 260 of sufficient height to space a top surface 262 of the base member 250 from the inner surface 264 of the cover member 252 to define a gap G0. In addition, the outer diameter D1 of the base member 250 is smaller than the inner diameter of the cover member 252 to define a gap G1 between the outer peripheral face 270 of the base member 250 and the inner peripheral face 272 of the cover member 252. Still further, the cover member 252 is sufficiently thin so that the rear face 280 of the cover member 250 is spaced from the wall 140 of the shield 106 so as to define another gap G2. It is seen that the gaps G2, G1, G0 define a plurality of passageways as represented by the arrow 290 between the cover member 252 and the shield wall 140 and also between the cover member 252 and the insulative base member 250. The arrow 290 represents the multi-angled path that deposition material would have to take in order to coat the interior of the standoff 120. To short the coil 104 to the shield wall 140, it would be necessary for the deposition material to coat the interior of the standoff 120 to an extent such that a complete conductive path is provided by the deposition material from the cover member 252 to the insulative base member 250. To make such a complete conductive path, the deposition material would have to bridge either the gap G2 at the entrance to the interior of the standoff 120 or the gap G1 or gap G0 of the internal passageways 290 unless the conductive deposition material reached all the way to the innermost wall 260 of the insulative base member 250. If the conductive deposition material coated the inner surfaces 264 and 272 of the cover member 252 and the surfaces 262 and 270 of the insulative member and coated the inner wall 260 of the base member 250, a complete conductive path could be formed from the coil 106 to the shield wall 140.

To further retard such a complete conductive path from forming, the front face 262 of the base member 250 has a plurality of concentric channels 300a, 300b, 300c which are positioned to accumulate conductive deposition material from the target to prevent the deposition material from reaching the inner wall 260 and causing a short. The concentric channels may have varying widths with the outer channels preferably having the greater width so as to accumulate deposited material to prevent sufficient material from accumulating adjacent the gap G0 which could bridge the gap G0. It has been found that this labyrinth structure permits the plasma chamber to be used for a relatively large number of depositions of conductive metal without causing a short between the coil and the shield. In addition, the overall thickness of the standoff 120 is relatively thin. As a consequence, the overall diameter of the plasma chamber can be made smaller because of the reduced thickness of the standoffs.

In the illustrated embodiment, the insulative base member 250 has a diameter D1 of 1.50 inches and the gap G1 between the outer periphery 270 of the base member 250 and the inner periphery 272 of the cover member 252 is 0.10 inches. It has been found that the ratio of the diameter D1 of the insulative base member 252 to the gap G1 between the outer periphery 270 of the base member 250 and the inner periphery 272 of the cover member 252 is preferably a ratio of 14 or greater. The diameter to gap ratio of the illustrated embodiment of FIG. 4 is 15.

Another ratio which has been found important in preventing shorts through the standoffs is the ratio between the length L1 of the passageway between the rear face 280 of the cover member 252 and the front face 262 of the insulative base member 250, to the width of that passageway which is the gap G1. In the illustrated embodiment, the length of the passageway L1 is 0.19 inches and the gap G1 is 0.10 inches which provide an aspect ratio of 1.9 or approximately 2. It has been found that an aspect ratio substantially below 2 is not as effective in preventing shorts through the standoff.

It is also desirable to reduce the width of the gap G0 to retard the travel of deposition materials toward the inner wall 260. On the other hand, the gap G0 should not be made so narrow as to facilitate the formation of a bridge of deposition material across the gap G0 which could short the two sides of the gap together. In the illustrated embodiment, a gap G0 of 0.05 inches has been found satisfactory as noted above. In addition, the length of travel L2 from the periphery 270 to the inner wall 260 of the insulative base member 250 is 0.50 inches in the illustrated embodiment. Thus, the aspect ratio of this portion of the passageway is 0.5/0.05 or 10. It is believed that a lower aspect ratio could undesirably increase the chances of a short occurring.

As previously mentioned, the base member 250 has a plurality of concentric channels 300a, 300b and 300c to accumulate deposition material to prevent it from reaching the inner wall 260. In the illustrated embodiment, the channels 300a, 300b and 300c have widths of 0.10, 0.05 and 0.05, respectively. Increasing the number and widths of these channels can further reduce the chance of a short but such is likely to result in increasing the overall width of the standoff which may not be acceptable for some applications. Furthermore, to simplify manufacture, the number of channels can be reduced to as few as one but such a simplified design may increase the chance of a short. Here too, the gaps G0, G1 and G2 should be chosen as discussed above to reduce the chances of a short.

Figure 5:
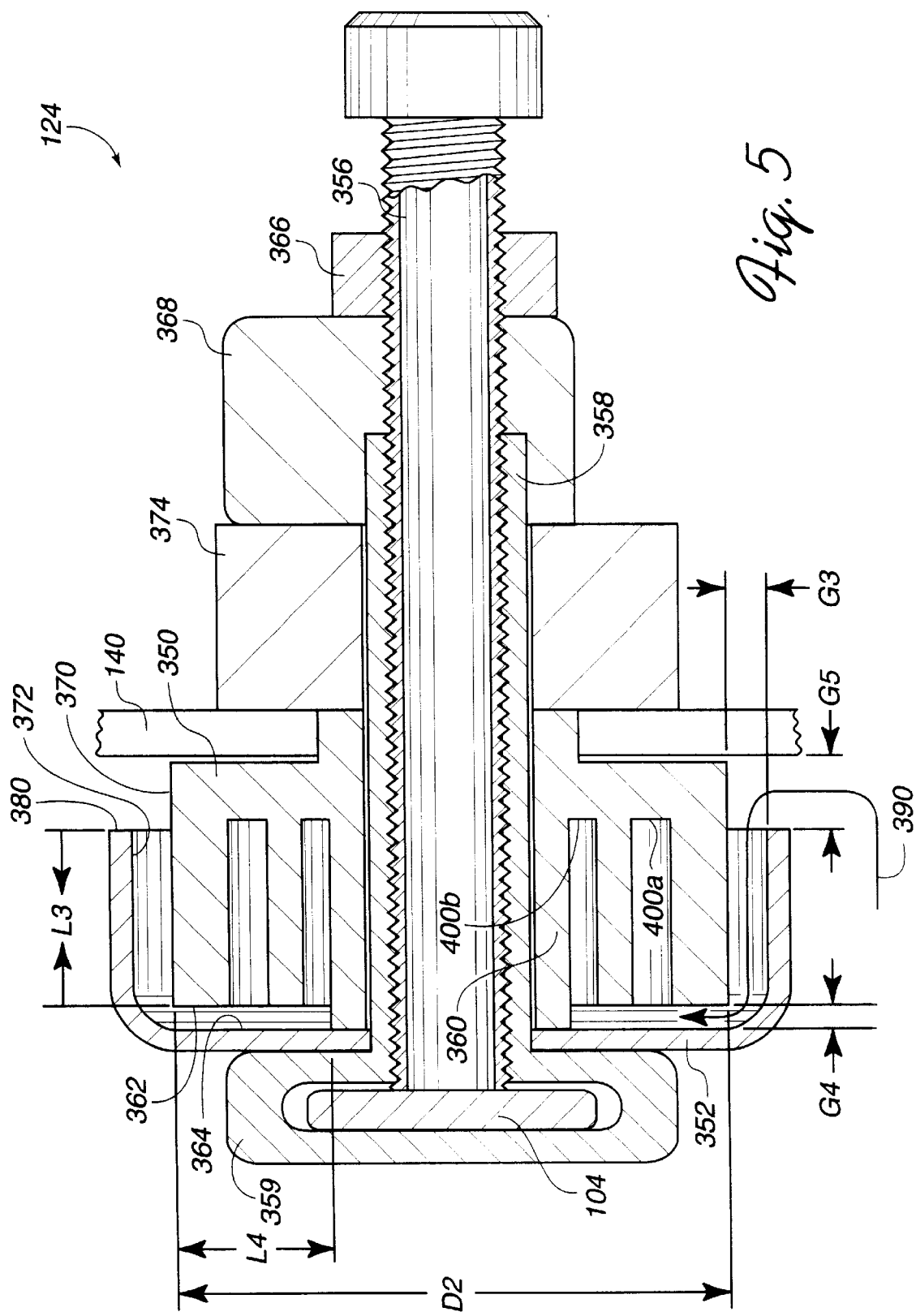
FIG. 5 is a cross-sectional view of a coil feedthrough standoff of the plasma generating chamber of FIG. 2.

FIG. 5 illustrates the coil feedthrough standoff 124 in greater detail. The coil feedthrough standoff 124, like the coil standoff 120 has a generally disk-shaped insulative base member 350 and a generally cylindrical cover member 352 of bead blasted titanium which covers the insulative base member 350. However, the feedthrough standoff 124 has a central aperture through which extends a threaded conductive feedthrough bolt 356 through which RF power is applied to the coil 104. The feedthrough bolt 356 is received by a titanium sleeve 358 which has a termination sleeve 359 of bead blasted titanium which receives the coil 104. RF current propagates along the surfaces of the sleeves 358 and 359 to the coil 104. The feedthrough standoff 124 is secured to the wall 140 of the shield by the insulative base member on the interior side of the wall 140 and a nut 366 threaded onto the feedthrough bolt 356 on the other side of the wall 140. The nut 366 is spaced from the wall 140 by a connector 368 and an insulative spacer 374. The electrical connector 368 connects the feedthrough to an RF generator (not shown) through a matching network (also not shown).

The feedthrough standoff 124 also has an internal labyrinth structure somewhat similar to that of the coil standoff 120 to prevent the formation of a short between the coil 104 and the wall 140 of the shield. Here, the insulative base member 350 has a diameter of D2 of 0.84 inches and a gap G3 of 0.06 inches between the outer periphery 370 of the base member 350 and the inner periphery 372 of the cover member 352. Hence, the ratio of the diameter D2 to the gap G3 is 14, similar to the diameter to gap ratio of 15 of the coil standoff 120 of FIG. 4. However, the aspect ratio of the feedthrough standoff 124 of FIG. 5 is larger than the aspect ratio of the coil standoff 120 of FIG. 4. Here, the length L3 of the passageway between the outer periphery 370 of the insulative base member 350 and the inner periphery 372 of the cover member 352 is 0.27 inches. Hence, the aspect ratio of the length L3 to the gap G3 is 4.5. Consequently, the larger aspect ratio of the embodiment of FIG. 5 may be more effective in preventing undesirable shorts.

In the illustrated embodiment, a gap G4 of 0.04 inches between the front face 362 of the base member 350 and the rear face 364 of the cover member 352 has been found satisfactory. In addition, the length of travel L4 from the periphery 370 to the inner wall 360 of the insulative base member 350 is 0.24 inches in the illustrated embodiment. Thus, the aspect ratio of this portion of the passageway 390 is 0.24/0.04 or 6. It is believed that a lower aspect ratio could undesirably increase the chances of a short occurring.

The base member 350, like the base member 250 has a plurality of concentric channels 400a, and 400b to accumulate deposition material to prevent it from reaching the inner wall 360. In the illustrated embodiment, the channels 400a and 400 have widths of 0.06 and 0.04 inches, respectively. The gap G5 between the rear face 380 of the cover member 350 and the shield is 0.12 inches.

It should be recognized that other dimensions, shapes and numbers of channels of the labyrinth are possible, depending upon the particular application. Factors affecting the design of the labyrinth include in addition to those discussed above, the type of material being deposited and the number of depositions desired before the standoffs need to be cleaned or replaced.

Each of the embodiments discussed above utilized a single helical coil in the plasma chamber. It should be recognized that the present invention is applicable to plasma chambers having more than one coil. For example, the present invention may be applied to multiple coil chambers for launching helicon waves of the type described in copending application Ser. No. 08/559,345 referenced above.

The coil 104 of the illustrated embodiment is made of ½ by ⅛ inch heavy duty bead blasted titanium or copper ribbon formed into a three turn helical coil. However, other highly conductive materials and shapes may be utilized. For example, the thickness of the coil may be reduced to $\frac{1}{16}$ inch and the width increased to 2 inches. Also, hollow copper tubing may be utilized, particularly if water cooling is desired. The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil is preferably 2 MHz but it is anticipated that the range can vary at other a.c. frequencies such as, for example, 1 MHz to 100 MHz and non-RF frequencies.

In the illustrated embodiment, the shield 106 has an inside diameter of 16" but it is anticipated that good results can be obtained with a width in the range of 6"–25". The shields may be fabricated from a variety of materials including insulative materials such as ceramics or quartz. However, the shield and all metal surfaces likely to be coated with the target material are preferably made of a material such as stainless steel or copper unless made of the same material as the sputtered target material. The material of the structure which will be coated should have a coefficient of thermal expansion which closely matches that of the material being sputtered to reduce flaking of sputtered material from the shield or other structure onto the wafer. In addition, the material to be cooled should exhibit good adhesion to the sputtered material. Thus, for example if the deposited material is titanium, the preferred metal of the shields, coils, brackets and other structures likely to be coated is bead blasted titanium. Of course, if the material to be deposited is a material other than titanium, the preferred metal is the deposited material, stainless steel or copper. Adherence can also be improved by coating the structures with molybdenum prior to sputtering the target.

The wafer to target space is preferably about 140 mm but can range from about 1.5" to 8". A variety of precursor gases may be utilized to generate the plasma including Ar, $H_2$, $O_2$ or reactive gases such as $NF_3$, $CF_4$ and many others. Various precursor gas pressures are suitable including pressures of 0.1–50 mTorr. For ionized PVD, a pressure between 10 and 100 mTorr is preferred for best ionization of sputtered material.

Figure 6:
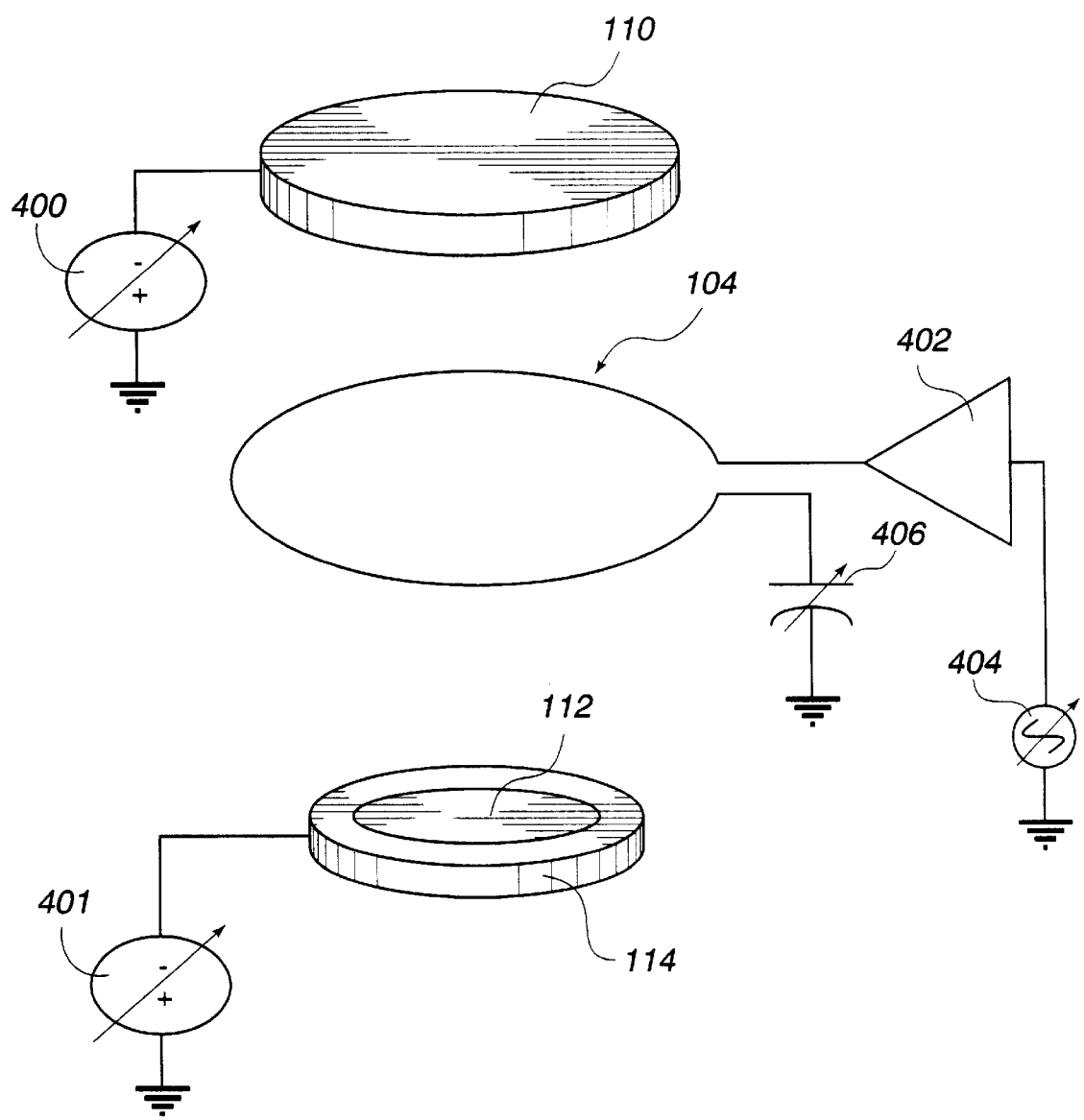
FIG. 6 is a schematic diagram of the electrical interconnections to the plasma generating chamber of FIG. 1.

FIG. 6 is a schematic representation of the electrical connections of the plasma generating apparatus of the illustrated embodiment. To attract the ions generated by the plasma, the target 110 is preferably negatively biased by a variable DC power source 400 at a DC power of 3 kW. In the same manner, the pedestal 114 may be negatively biased by a source 401 at −30 v DC to negatively biased the substrate 112 to attract the ionized deposition material to the substrate. One end of the coil 104 is coupled to an RF source such as the output of an amplifier and matching network 402, the input of which is coupled to an RF generator 404 which provides RF power at approximately 4.5 kW. The other end of the coil 104 is coupled to ground, preferably through a capacitor 406 which may be a variable capacitor.

As set forth in greater detail in copending application Ser. No. 08/680,335, entitled Sputtering Coil for Generating a Plasma, filed Jul. 10, 1996 (Attorney Docket 1390-CIP/PVD/DV) and assigned to the assignee of the present application, which application is incorporated herein in its entirety by reference, the coil 104 may also be positioned in such a manner that the coil may sputter as well as the target. As a result, the deposited material may be contributed by both the target and the coil. Such an arrangement has been found to improve the uniformity of the deposited layer. In addition, the coil may have as few turns as a single turn to reduce complexity and costs and facilitate cleaning.

Figure 7:
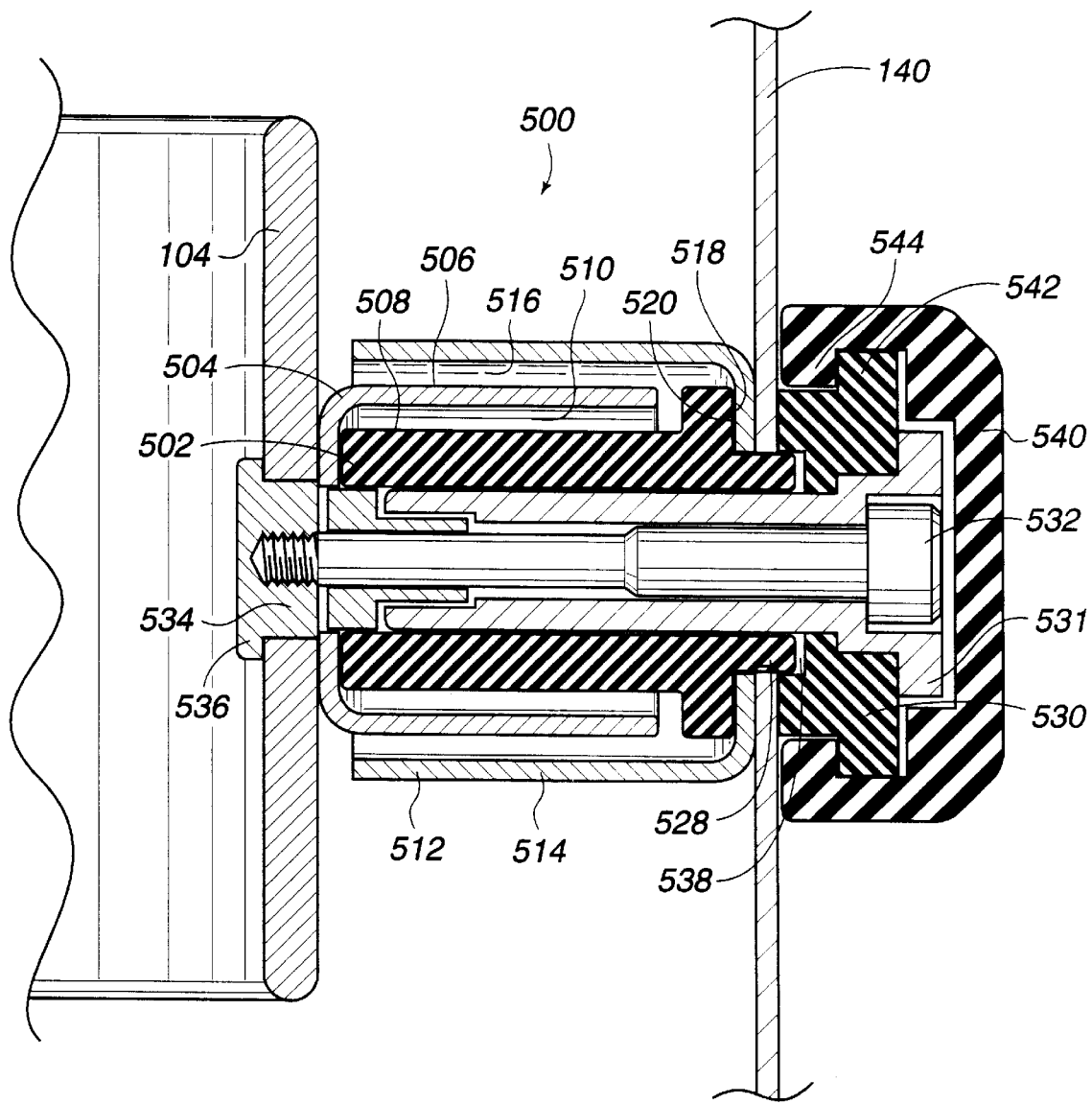
FIG. 7 is a cross-sectional view of a coil standoff in accordance with an alternative embodiment.

FIG. 7 is a cross-sectional view of a support standoff 500 in accordance with an alternative embodiment. In the embodiment of FIG. 7, the standoff 500 includes a cylindrical insulative base member 502 and a cup-shaped metal cover member 504 having a cylindrically shaped side wall 506 spaced from the lateral side 508 of the base member 502 to form a labyrinthine passageway 510 oriented substantially transverse to the wall 140 of the shield. The base member 502 of the standoff 500 does not have the concentric channels 300 that the base member 250 of the standoff of FIG. 4 has. It is believed that for many applications, the passage way 510 of the standoff 500 of FIG. 7 may suffice in preventing the formation of a path of deposition material across the standoff which could short the coil 104 to the shield 106. Because of this simplification, the base member 502 may be more easily and less expensively manufactured than the base member 250, particularly when fabricated from materials such as ceramics which are not readily machined.

In accordance with another aspect of the present invention, the standoff 500 of FIG. 7 comprises a second cup-shaped metal cover member 512 having a cylindrically shaped side wall 514 spaced from the side 506 of the first cover member 502 to form a second labyrinthine passageway 516 oriented generally parallel to the passageway 510 to further reduce the likelihood of the formation of a shorting conductive path. However, the second cover member 512 performs another function. The second cover member 512 has a back wall 518 positioned between a shoulder 520 of the base member 502 and the shield wall 140. The base member shoulder 520 ensures that the second cover member 512 is tightly engaged against and in good electrical contact with the shield wall 104 which is maintained at electrical ground. Accordingly, the second cover member 512, spaced from the first cover member 504, is likewise maintained at ground. On the other hand, the first cover member 504 is tightly engaged against the coil 104. Consequently, the cover member 504 is at the same potential as the coil 104 and hence may sputter. Because the second cover member 512 is at ground potential and is positioned to cover most of the exposed surfaces of the first cover member 504, it is believed that the second cover member can substantially reduce sputtering of the first cover member 504 in those applications in which sputtering of the standoffs is undesirable. Even in those applications in which the coil 104 is sputtered to enhance the uniformity of deposition on the substrate, sputtering of the standoffs may introduce nonuniformities since the standoffs are typically not arrayed in a continuous ring around the substrate. Hence, retarding sputtering of the standoffs may be useful in a number of applications.

The first insulative base member 502 has a collar 528 which extends through an opening in the shield wall 140. The standoff 500 further includes a second insulative base member 530 positioned on the other side of the shield wall 140 from the first insulative base member 502. Seated in a metal sleeve 531 is a bolt 532 which passes through interior openings in the sleeve 531, second insulative base member 530, shield wall 140, second cover member 512, and first insulative base member 502. A nut 534 having flanges 536 passes through openings in the coil 104, first cover member 504 and the first insulative base member 502 and threadably fastens to the bolt 532. The nut flanges 536 engage the coil 104 and compress the assembly of the standoff 500 together to secure the standoff and coil 104 to the shield wall 140.

The collar 528 of the first insulative base member 502 insulates the metal sleeve 531 and the bolt 532 from the grounded shield wall 140. A space 538 is provided between the collar 528 and the second insulative base member 530 so that the compressive force of the bolt 532 and the nut 534 does not damage the insulative members which may be made of breakable materials such as ceramics. The end of the bolt 532 may be covered by a third insulative member 540 which, in the illustrated embodiment is button-shaped. The second insulative base member has a flange 542 spaced from the shield wall 140 which receives a lip 544 of the insulative cover member 540 to retain the cover member 540 in place.

Figure 8:
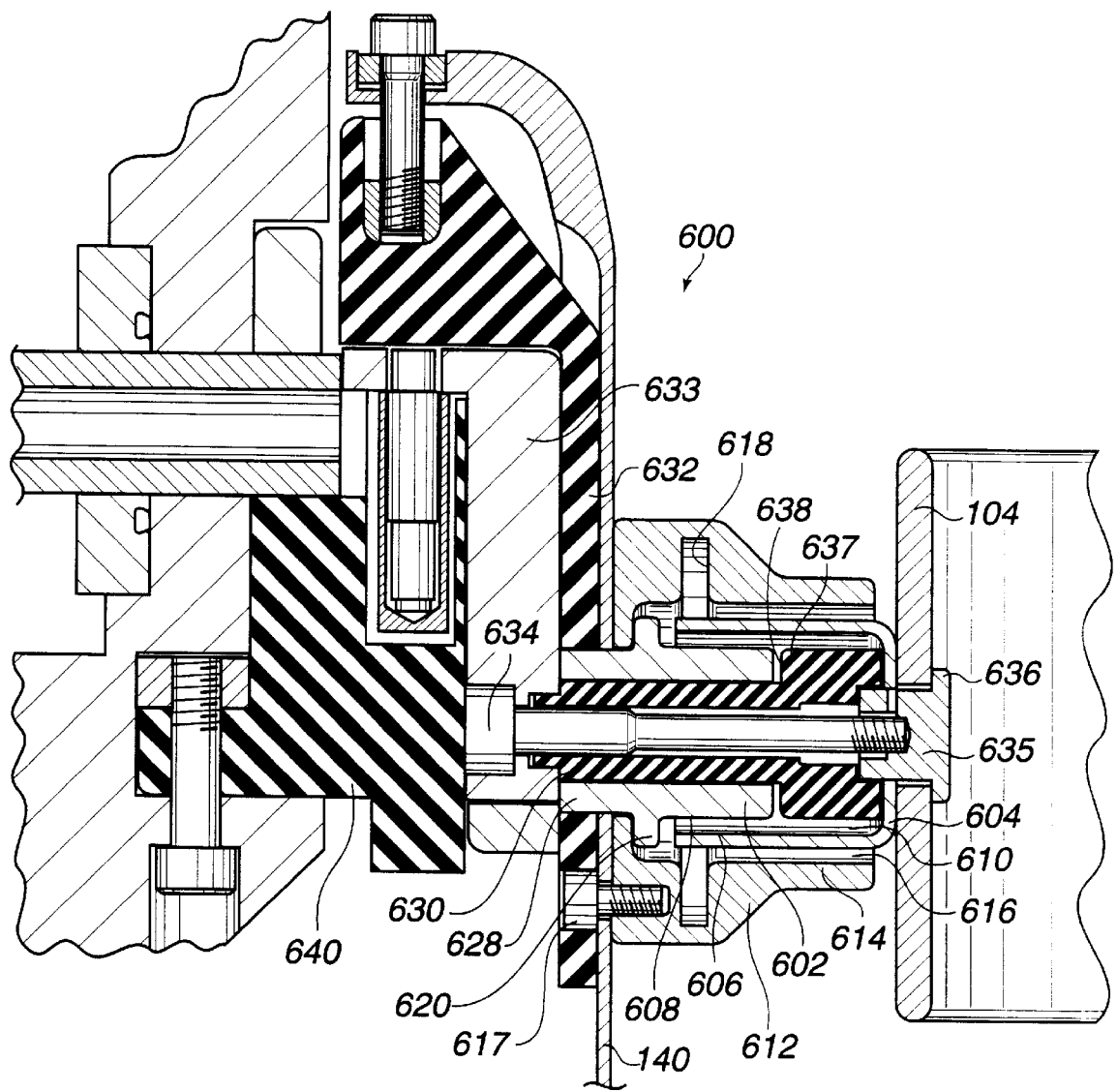
FIG. 8 is a cross-sectional view of a coil feedthrough standoff in accordance with an alternative embodiment.

FIG. 8 is a cross-sectional view of a feedthrough standoff 600 in accordance with an alternative embodiment. Like the support standoff 500 of FIG. 7, the feedthrough standoff 600 includes a cylindrical insulative base member 602 and a cup-shaped metal cover member 604 having a cylindrically shaped side wall 606 spaced from the lateral side 608 of the base member 602 to form a labyrinthine passageway 610 oriented substantially transverse to the wall 140 of the shield. In addition, the standoff 600 of FIG. 8 has a second cup-shaped metal cover member 612 having a cylindrically shaped side wall 614 spaced from the side 606 of the first cover member 602 to form a second labyrinthine passageway 616 oriented generally parallel to the passageway 610 to further reduce the likelihood of the formation of a shorting conductive path.

The second cover member 612 is fastened to the shield wall 140 by screw fasteners 617 which ensure that the second cover member 612 is tightly engaged against and in good electrical contact with the shield wall 104 and therefore grounded to retard sputtering of the first cover member 604. An annular shaped channel 618 in the second cover member is coupled to the threaded holes for the fasteners 617 to vent gases that might inadvertently be trapped in the fastener holes. A base member shoulder 620 between the end of the first cover member 604 and the second cover member 612 has sufficient clearance so as to avoid stress on the insulative base member 602.

The first insulative base member 602 has a collar 628 which extends through an opening in the shield wall 140. Seated in the insulative base member 602 and the collar 628 is a conductive metal sleeve 630 which passes from one side of the shield wall 140 to the other. The standoff 600 further includes a second insulative base member 632 positioned on the other side of the shield wall 140 from the first insulative base member 602. Seated in the second insulative base member 632 and engaging the end of the sleeve 630 is a conductive metal bar 633. Seated in the conductive metal bar 633 is a bolt 634 which passes through interior openings in the bar 633 and sleeve 630 to the coil side of the shield wall 140. A nut 635 having flanges 636 passes through openings in the coil 104, first cover member 604 and the sleeve 630 and threadably fastens to the bolt 634. The nut flanges 636 engage the coil 104 and compress the assembly of the standoff 600 together to secure the feedthrough standoff and coil 104 to the shield wall 140.

The collar 628 of the first insulative base member 602 insulates the metal sleeve 630 and the bolt 634 from the grounded shield wall 140. The second insulative member 632 insulates the conductive bar 633 from the grounded shield wall 140. RF current travels along the surface of the conductive bar 633 from an RF source exterior to the chamber, along the surfaces of the sleeve 630, the first cover member 604 engaging the end of the sleeve to the coil 104 engaging the first cover member 604. The sleeve 630 has a shoulder 637 to retain the first insulative member 602 in place. However, a space 638 is provided between the shoulder 637 and the first iinsulative base member 604 so that the compressive force of the bolt 634 and the nut 635 does not damage the insulative members which may be made of breakable materials such as ceramics.

As set forth above, the conductive bar 633 carrying RF currents from the exterior generator to the feedthrough is seated in a second insulative member 632. Covering the other side of the conductive bar 633 and the end of the bolt 634 is a third insulative member 640. The insulative members 632 and 640 conform around the RF conductive members to fill the available space to avoid leaving spaces larger than a darkspace to inhibit formation of a plasma and arcing from the conductive bar 633 and the bolt 634.

In those applications in which sputtering of the coil is desired to improve deposition uniformity on the substrate, the coil may be positioned closer to the substrate such that the coil 104 is within line of sight of the target 110. However, such a position will likely increase deposition onto the standoffs. In addition, it is preferred that the coil position not pass the line between the edge of the target 110 and the edge of the substrate 112 so that the coil does not "shadow" the substrate 112.

It will, of course, be understood that modifications of the present invention, in its various aspects, will be apparent to those skilled in the art, some being apparent only after study others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A standoff for supporting a coil in a semiconductor fabrication system having a wall upon which deposition material is deposited, comprising:
    a first base member adapted to be coupled to the wall; and
    a first cover member adapted to be coupled to the coil, said cover member being positioned over the base member, said cover member and base member defining a passage between the base member and the cover member, wherein at least one of the cover member and the base member is made of an insulative material.

2. The standoff of claim 1 further comprising a second cover member positioned to at least partially cover said first cover member.

3. The standoff of claim 2 wherein said first and second cover members are each cup-shaped.

4. The standoff of claim 2 wherein said second cover member comprises a conductive metal.

5. The standoff of claim 4 wherein said second cover member is biased at a potential level to inhibit sputtering of said second cover member.

6. The standoff of claim 5 wherein said second cover member is coupled to electrical ground.

7. The standoff of claim 2 wherein said second cover member is spaced from said first cover member to define a passageway between said first and second cover members.

8. The standoff of claim 1 further comprising a second base member adapted to be coupled to said wall, and a fastener for fastening said first and second base members to compress said wall between said first and second base members.

9. The standoff of claim 8 wherein said first and second base members each has a shoulder portion positioned to oppose said shoulder portion of said other base member with a portion of said wall between said shoulder portions of said first and second base members.

10. The standoff of claim 9 wherein said wall has an opening and one of said first and second base members has a collar portion adapted to extend through said wall opening.

11. The standoff of claim 10 wherein said collar portion is spaced from the other of said first and second base members.

12. The standoff of claim 11 wherein said first and second base members are formed of an electrically insulative material.

13. The standoff of claim 12 wherein said first and second base members are formed of a ceramic material.

14. The standoff of claim 8 further comprising a second cover member positioned to at least partially cover said first cover member wherein said fastener comprises a post and said wall, said first and second cover members and said first and second base members each has an opening aligned to receive said post so that said post passes through said wall, said first and second cover members and said first and second base member openings.

15. The standoff of claim 14 wherein said post is formed of a conductive material and has a first end coupled to said coil and a second end extending though said wall opening, said standoff further comprising a third cover member positioned to cover at least a portion of said post second end, said third cover member being formed of an insulative material.

16. The standoff of claim 15 wherein said second base member has a shoulder portion spaced from said wall and said third cover member has a lip portion positioned between said wall and said second base member shoulder portion to retain said third cover member on said second base member.

17. The standoff of claim 14 wherein said coil defines an opening adapted to receive said fastener and said fastener further comprises a flange portion adapted to engage said coil.

18. The standoff of claim 17 wherein said fastener further comprises a nut having a threaded portion and said flange portion and said post has a threaded portion adapted to engage and retain said nut threaded portion.

19. The standoff of claim 1 wherein said cover member and base member are spaced to define a plurality of passages between said base member and said cover member wherein said passages are angled with respect to each other to retard the passage of deposition material through said passages.

20. The standoff of claim 1 wherein the base member has an outer periphery which defines a diameter and the cover member has an inner periphery spaced from the outer periphery of the base member by a first gap which defines a first of the plurality of passages wherein the ratio of the base member diameter to the gap is 14 or more.

21. The standoff of claim 20 wherein the first passageway has a first length and the aspect ratio of the first length to the first gap is 2 or more.

22. The standoff of claim 1 wherein the base member has a front face which defines a plurality of channels which are coupled to at least one of the plurality of passageways to retard the passage of deposition material through the passages.

23. The standoff of claim 22 wherein the base member has three concentric channels in which the outermost channel has the greatest width.

24. The standoff of claim 1 wherein the base member has a front face and the cover member has a rear face and one of the base and cover members has an insulative upstanding wall adjacent the center of the member which spaces the base member front face from the cover member rear face by a first gap which defines a first of the plurality of passages having a first length wherein the ratio of the first length to the first gap is 6 or more.

25. A standoff for coupling RF current through an opening in a wall to a coil in a semiconductor fabrication system, comprising:
   a first conductive member adapted to extend through said wall opening, said first conductive member having first and second ends, said first end being positioned on a first side of said wall and being adapted to be coupled to a source of RF current, and said second end being positioned on a second side of said wall opposite said first side of said wall and being adapted to be electrically coupled to said coil;
   a first insulative base member adapted to extend through said wall opening between said conductive member and said wall to insulate said conductive member from said wall; and
   a first cover member positioned to at least partially cover said base member, said first cover member and base member defining a passage between said first base member and said first cover member.

26. The standoff of claim 25 further comprising a second cover member positioned to at least partially cover said first cover member.

27. The standoff of claim 26 wherein said first and second cover members are each cup-shaped.

28. The standoff of claim 26 wherein said second cover member comprises a conductive metal.

29. The standoff of claim 28 wherein said second cover member is biased at a potential level to inhibit sputtering of said second cover member.

30. The standoff of claim 29 wherein said second cover member is coupled to electrical ground.

31. The standoff of claim 26 wherein said second cover member is spaced from said first cover member to define a passageway between said first and second cover members.

32. The standoff of claim 25 further comprising a second conductive member positioned on said first side of said wall and adapted to be electrically coupled to said first conductive member, and a second insulative base member adapted to be coupled to said wall between said second conductive member and said wall to insulate said second conductive member from said wall.

33. The standoff of claim 32 further comprising a first fastener for fastening said first and second conductive members together.

34. The standoff of claim 33 further comprising further a second cover member positioned to at least partially cover said first cover member and a second fastener for fastening said second cover member to said wall.

35. The standoff of claim 34 wherein said second cover defines a passageway coupled to said second fastener to vent said second fastener.

36. The standoff of claim 32 wherein said first and second conductive members each has a shoulder portion positioned to oppose said shoulder portion of said other conductive member.

37. The standoff of claim 36 wherein said wall has an opening and one of said first and second base members has a collar portion adapted to extend through said wall opening.

38. The standoff of claim 37 wherein said portion is spaced said other of said first and second base members.

39. The standoff of claim 38 wherein said first and second base members are formed of an electrically insulative material.

40. The standoff of claim 25 wherein said first and second base members are formed of a ceramic material.

41. The standoff of claim 32 further comprising a second cover member positioned to at least partially cover said first cover member wherein said fastener comprises a post and said wall, said first and second cover members and said first and second base members each has an opening aligned to receive said post so that said post passes through said wall, said first and second cover members and said first and second base member openings.

42. The standoff of claim 41 wherein said post is formed of a conductive material and has a first end coupled to said coil and a second end extending though said wall opening, said standoff further comprising a third cover member positioned to cover at least a portion of said post second end, said third cover member being formed of an insulative material.

43. The standoff of claim 42 wherein said second base member has a shoulder portion spaced from said wall and said third cover member has a lip portion positioned between said wall and said second base member shoulder portion to retain said third cover member on said second base member.

44. The standoff of claim 41 wherein said coil defines an opening adapted to receive said fastener and said fastener further comprises a flange portion adapted to engage said coil.

45. The standoff of claim 44 wherein said fastener further comprises a nut having a threaded portion and said flange portion, and said post has a threaded portion adapted to engage and retain said nut threaded portion.

46. The standoff of claim 25 wherein said cover member and base member are spaced to define a plurality of passages between said base member and said cover member wherein said passages are angled with respect to each other to retard the passage of deposition material through said passages.

47. The standoff of claim 25 wherein the base member has an outer periphery which defines a diameter and the cover member has an inner periphery spaced from the outer periphery of the base member by a first gap which defines a first of the plurality of passages wherein the ratio of the base member diameter to the gap is 14 or more.

48. The standoff of claim 47 wherein the first passageway has a first length and the aspect ratio of the first length to the first gap is 2 or more.

49. The standoff of claim 25 wherein the base member has a front face which defines a plurality of channels which are coupled to at least one of the plurality of passageways to retard the passage of deposition material through the passages.

50. The standoff of claim 49 wherein the base member has three concentric channels in which the outermost channel has the greatest width.

51. The standoff of claim 25 wherein the base member has a front face and the cover member has a rear face and one of the base and cover members has an insulative upstanding wall adjacent the center of the member which spaces the base member front face from the cover member rear face by a first gap which defines a first of the plurality of passages having a first length wherein the ratio of the first length to the first gap is 6 or more.

52. A standoff for supporting a coil in a semiconductor fabrication system having a wall upon which deposition material is deposited, comprising:
   a first base member adapted to be coupled to the wall;

a first cover member adapted to be coupled to the coil, said cover member being positioned over the base member, said cover member and base member defining a passage between the base member and the cover member; and a second cover member positioned to at least partially cover said first cover member.

53. A standoff as in claim 52, wherein said first cover member and second cover member face in opposite directions.

54. A standoff as in claim 52, wherein said second cover member is spaced apart from said first cover member.

55. A standoff for coupling RF current though an opening in a wall to a coil in a semiconductor fabrication system, comprising:

a first conductive member adapted to extend through said wall opening, said first conductive member having first and second ends, said first end being positioned on a first side of said wall and being adapted to be coupled to a source of RF current, and said second end being positioned on a second side of said wall and being adapted to be electrically coupled to said coil;

a first insulative base member at least partially positioned in said wall opening to insulate said conductive member from said wall;

a first cover member positioned to at least partially cover said base member, said first cover member and base member defining a passage between said first base member and said first cover member; and a second cover member positioned to at least partially cover said first cover member.

56. A standoff as in claim 55, wherein said first cover member and second cover member face in opposite directions.

57. A standoff as in claim 55, wherein said second cover member is spaced apart from said first cover member.

58. A standoff as in claim 25, wherein said first cover is spaced apart from said wall.

59. A standoff as in claim 25, further comprising a second cover member positioned to block sputtered material from accumulating on at least a portion of said first cover member.

60. A standoff as in claim 59, wherein said first cover member is spaced apart from said second cover member.

* * * * *